(12) United States Patent
Min

(10) Patent No.: US 8,975,143 B2
(45) Date of Patent: Mar. 10, 2015

(54) SELECTIVE GATE OXIDE PROPERTIES ADJUSTMENT USING FLUORINE

(71) Applicant: Byoung W. Min, Austin, TX (US)

(72) Inventor: Byoung W. Min, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/872,643

(22) Filed: Apr. 29, 2013

(65) Prior Publication Data

US 2014/0319596 A1    Oct. 30, 2014

(51) Int. Cl.
    *H01L 21/336*    (2006.01)
    *H01L 29/51*     (2006.01)

(52) U.S. Cl.
    CPC .................... *H01L 29/512* (2013.01)
    USPC ........... 438/287; 438/261; 438/783; 257/325; 257/411

(58) Field of Classification Search
    CPC ................ H01L 29/512; H01L 29/408; H01L 21/28255
    USPC .................. 438/287, 261, 783; 257/325, 411
    See application file for complete search history.

(56) References Cited

U.S. PATENT DOCUMENTS

| | | | |
|---|---|---|---|
| 6,541,321 | B1 | 4/2003 | Buller et al. |
| 7,012,005 | B2 | 3/2006 | Lichtenberger et al. |
| 7,163,871 | B2 | 1/2007 | Kubota et al. |
| 2003/0017689 | A1* | 1/2003 | Akram et al. .................. 438/595 |
| 2007/0063251 | A1* | 3/2007 | Tu et al. ......................... 257/315 |

OTHER PUBLICATIONS

Woerlee, P. et al., "Multiple Gate Oxide Technology Using Fluorine Implantation", IEEE, Proceeding of the 31st European Solid-State Device Research Conference, 2001, Sep. 11-13, 2001, pp. 107-110.

* cited by examiner

*Primary Examiner* — Tu-Tu Ho

(57) ABSTRACT

Fluorine is located in selective portions of a gate oxide to adjust characteristics of the gate oxide. In some embodiments, the fluorine promotes oxidation which increases the thickness of the selective portion of the gate oxide. In some embodiments, the fluorine lowers the dielectric constant of the oxide at the selective portion. In some examples, having fluorine at selective portions of a select gate oxide of a non volatile memory may reduce program disturb of the memory.

6 Claims, 6 Drawing Sheets

SELECTIVE GATE OXIDE PROPERTIES ADJUSTMENT USING FLUORINE

BACKGROUND OF THE INVENTION

1. Field of the Invention

This invention relates to semiconductor devices and more specifically to semiconductor devices having a gate oxide.

2. Description of the Related Art

Integrated circuits include transistors that have gates located on gate oxides, which are located over a semiconductor material. For example, in some types of non volatile memories, memory cells utilize select gates that have gate oxides.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As set forth herein, fluorine can be implanted at selective locations of a wafer to provide for increased thickness of a gate oxide and/or a decreased dielectric constant of the gate oxide material at selective portions of a gate oxide. In some examples, the selective areas may include those portions that will produce an edge region of a gate oxide. Hence, the techniques described herein may be used to increase the thickness and/or adjust the dielectric constant of the gate oxide at an edge region. This may be beneficial to reduce program disturb in a non volatile memory cell in some embodiments.

Figure 1:
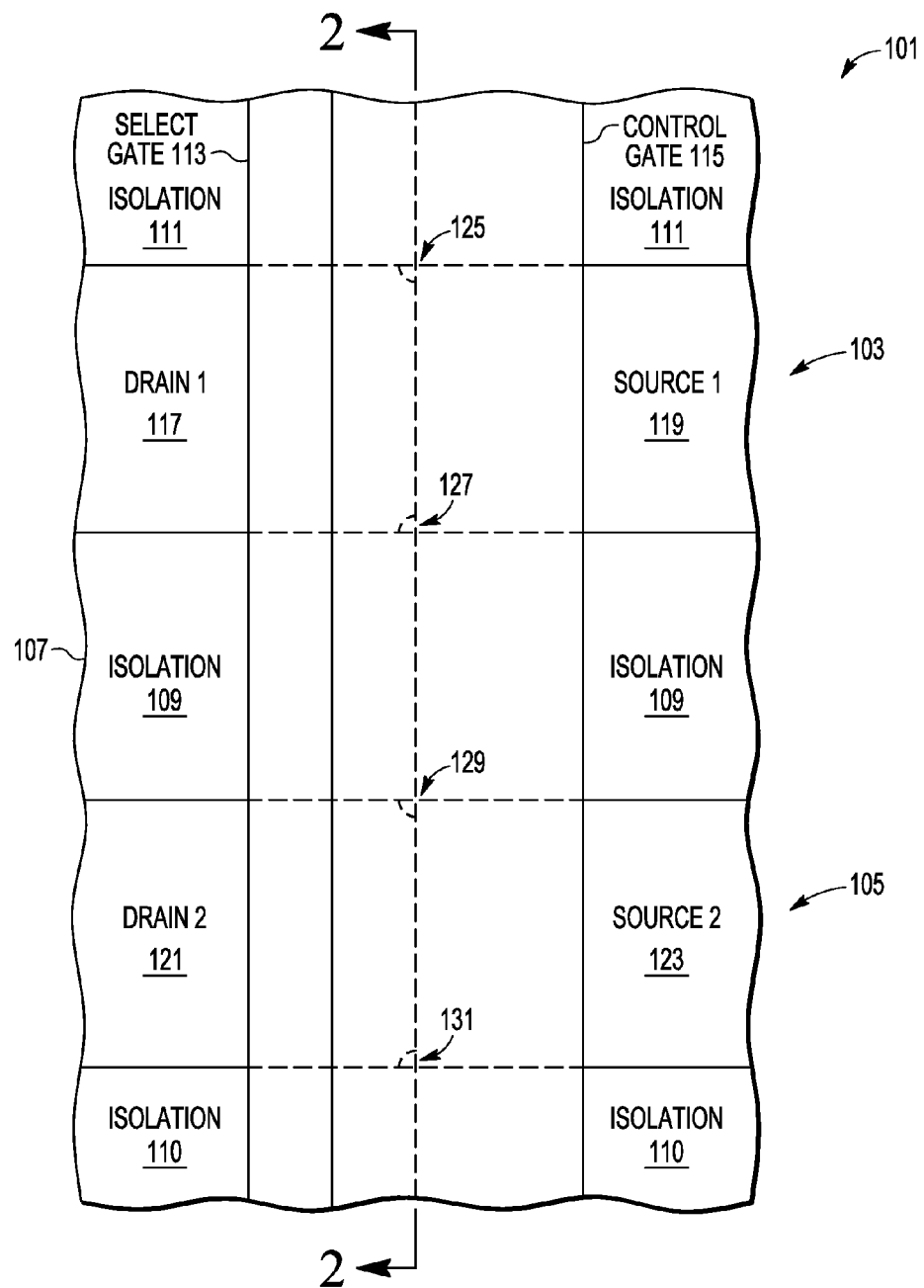
FIG. 1 is a partial top view of a wafer during a stage of manufacturing according to the prior art.

FIG. 1 shows a partial top view of a prior art wafer 101 during a stage of manufacturing. Shown in FIG. 1 are two memory cells 103 and 105. Memory cells 103 and 105 are split gate memory cells that include a control gate 115 and a select gate 113 that are located over substrate 107 across both cells 103 and 105. A left side portion (relative to the view of FIG. 1) of control gate 115 is located over a right side portion of select gate 113. Cell 103 includes a drain region 117 and a source region 119 located in semiconductor substrate 107 and generally separated by an area in substrate 107 beneath control gate 115 and select gate 113. Cell 105 includes a drain region 121 and a source region 123 located in substrate 107 and generally separated by an area in substrate 107 beneath control gate 115 and select gate 113. Memory cells 103 and 105 each include channel region located in active regions of substrate 107 beneath control gate 115 and select gate 113. Semiconductor substrate 107 includes isolation structures 111, 109, and 110 that run horizontally (relative to the view of FIG. 1) for isolating the memory cells structures in semiconductor substrate 107. Not shown in FIG. 1 is a charge storage structure located in a layer (see layer 210 of FIG. 2) below control gate 115.

Figure 2:
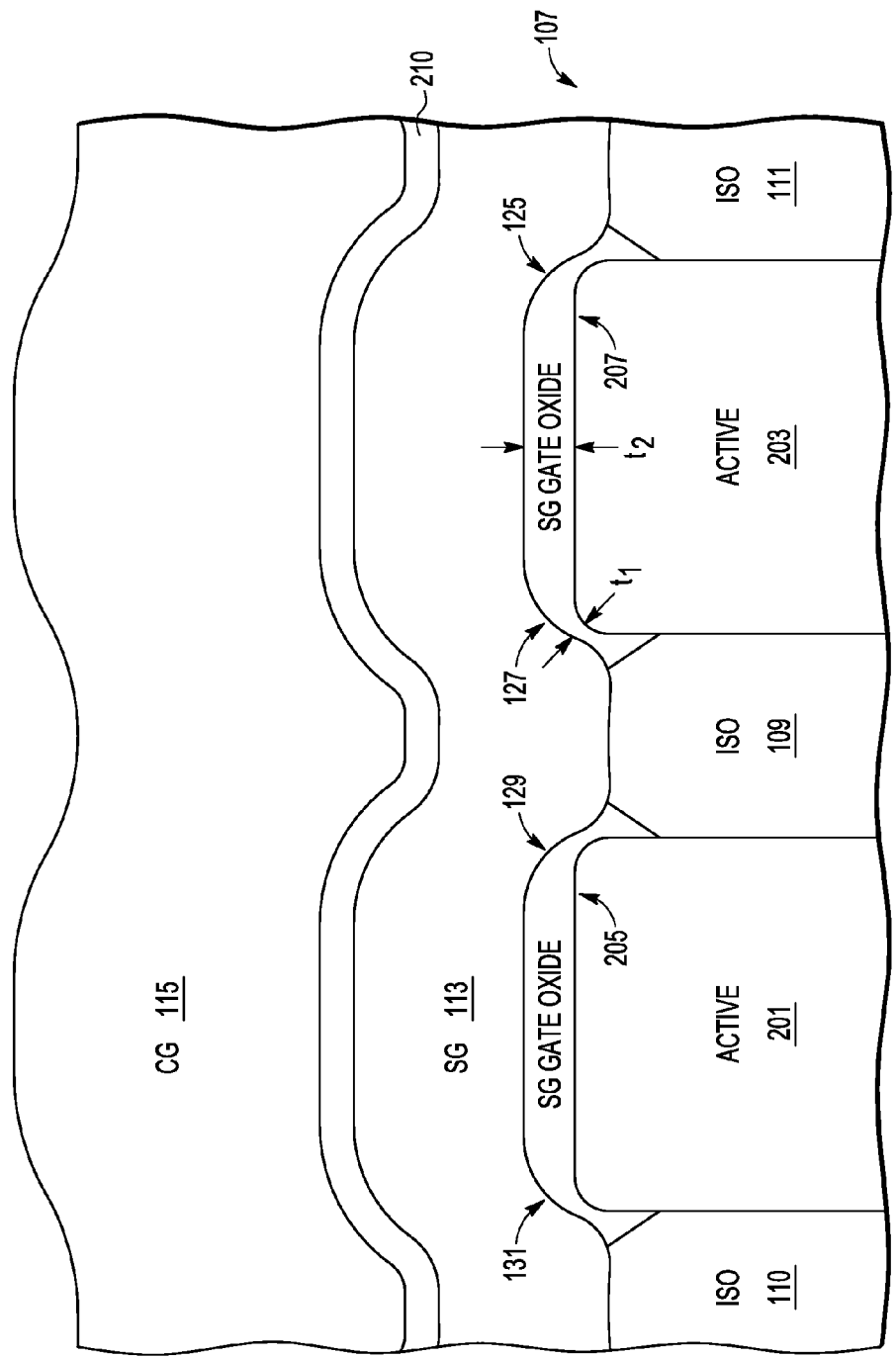
FIG. 2 is a partial cutaway side view of a wafer during a stage of manufacturing according to the prior art.

FIG. 2 shows a partial cutaway side view of wafer 101 at the cutline shown in FIG. 1 located along the right edge (as per the view of FIG. 1) of select gate 113. As shown in FIG. 2, active region 201 is a semiconductive material of substrate 107 for cell 105 and active region 203 is the semiconductive material of substrate 107 of cell 103. Regions 201 and 203 are separated by isolation structures 110, 109, and 111.

As shown in FIG. 2, select gate oxides 205 and 207 are located between select gate 113 and active regions 201 and 203, respectively, to isolate the select gate 113 from the active regions. In some examples, the select gate oxide is formed by an oxidation process of the active regions. One problem that may occur with such an oxidation process is that the thickness of the gate oxide may not be uniform, especially at the edge regions adjacent to the isolation structures (109-111). For example, the oxide at the corner regions 131, 129, 127, and 125 may have a thickness of t1 which is less than the thickness t2 at the middle of the gate oxide. This decreased thickness at the edge region may be due to the semiconductor material from which the gate oxide is oxidized having square corners prior to oxidation. Thus there is less semiconductor material at these locations to form oxide for both the sidewall and top portion of a corner region. Also, the semiconductor material may have a crystalline structure that oxidizes at different rates in different directions.

This decreased thickness of the select gate oxide at corner regions 125, 127, 129, and 131 may create a greater than desired electric field at those corner regions during some memory operations. For example, during a programming operation of cell 103, the decreased thickness of the select gate oxide at corner regions 129 and 131 of cell 105 may cause an increased electric field at those regions. This increased electric field at corner regions 131 and 129 may cause charge to undesirability to be stored in the charge storage structure (in layer 210) of cell 105. Thus, although cell 103 is desired to be programmed during a programming operation, some charge may undesirably be stored in the charge storage structure of cell 105. This may be considered a type of "program disturb" of a programming operation of a non volatile memory cell.

Figure 3:
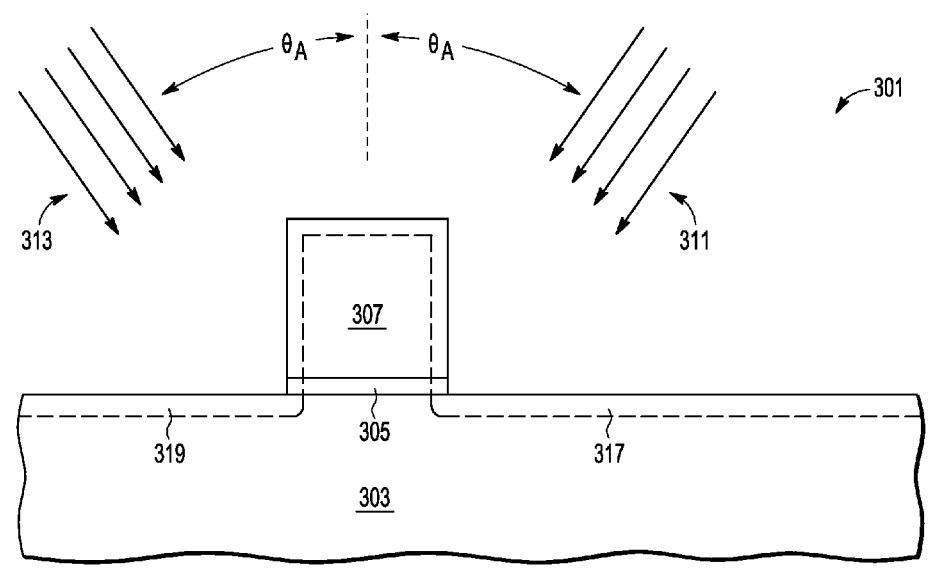
FIGS. 3 and 4 are partial cutaway side views of a wafer during various stages of manufacturing according to one embodiment of the present invention.
Figure 4:
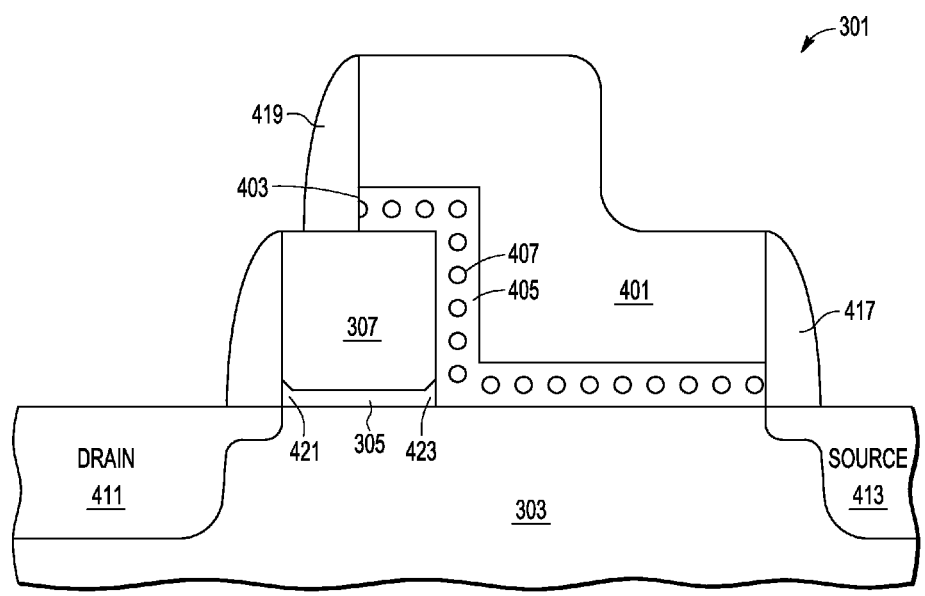

FIGS. 3-4 set forth different stages in the manufacture of a wafer according to one embodiment of the present invention where fluorine dopants are implanted in the wafer to increase the thickness and/or decrease the dielectric constant of selective portions of a gate oxide.

FIG. 3 is a partial cutaway side view of wafer 301 in which a select gate 307 is formed over substrate 303 that includes a semiconductor material. A select gate oxide 305 is located between gate 307 and substrate 303. In one embodiment, substrate 303 is made of a bulk mono crystalline material such as silicon, silicon germanium, an III-V semiconductor material or other type of semiconductor material. In other embodiments, substrate 303 may have other configurations such as a semiconductor on insulator (SOI) configuration. Substrate 303 may include dielectric structures (not shown). Also, substrate may include epitaxial silicon layers formed on a bulk silicon layer. In one embodiment substrate may be implanted with a conductivity dopant (e.g. N type or P type) such as boron, phosphorous, or arsenic.

Select gate 307 is formed from a conductive gate material such as doped polysilicon, metal, or combinations thereof. In one embodiment, gate 307 has a thickness in the range of 800-1500 angstroms, but may have other thicknesses in other embodiments. Select gate 307 is located on gate oxide 305 which can be made from a dielectric material such as silicon oxide or a high K dielectric such as hafnium oxide. In some embodiments, gate oxide 305 may include other dielectric materials or layers. In one embodiment, gate oxide 305 has a thickness in the range 20-40 Angstroms, but may have other thicknesses in other embodiments.

In one embodiment, select gate 307 and gate oxide 305 are formed by forming a gate oxide layer over substrate 303 and a gate material layer over the gate oxide layer. In one embodiment, the gate oxide layer may be formed by oxidizing substrate 303, but it may be formed by depositing an oxide layer in some embodiments. In some embodiments, the gate oxide layer may be partially formed by oxidation followed by a deposition of a dielectric material over the oxide layer. The gate layer and gate oxide layer are then photo lithographically patterned to form the structure shown in FIG. 3.

The view of FIG. 3 shows a stage where fluorine dopants 311 and 313 are being implanted at an angle into wafer 301 to form implant regions 319 and 317 in substrate 303. In the embodiment of FIG. 3, the fluorine dopants are also being implanted into edge regions of gate oxide 305 and into outer portions of select gate 307. The dopants are implanted at an angle ($\theta_A$) from the 90 degree normal of the surface of substrate 303 which allows for fluorine dopants to be implanted into an edge portion of gate oxide 305 and in substrate 303 underneath the edge of gate oxide 305. In one embodiment, the angle ($\theta_A$) is in the range of 7-45 degrees, but may be of other angles in other embodiments. In one embodiment, the fluorine dopants are implanted at an energy in the range of 3-10 KeV and at a dosage of $10^{13}$ to $10^{15}$ ions/cm$^2$, but other dosages and energies may be used in other embodiments. In one embodiment, the fluorine is implanted to a depth of 10-50 Angstroms, but may be implanted to other depths in other embodiments. In some embodiments, the fluorine dopants may be implanted before the photo resist mask used to pattern gate 307 is removed.

Although FIG. 3 shows dopants 313 and 311 being implanted simultaneously, these implants may be performed at separate times by rotating the wafer 180 degrees in the implantation tool.

FIG. 4 is a cutaway view of a subsequent stage in the manufacture of wafer 301. In the embodiment of FIG. 4, after the stage of FIG. 3, a charge storage layer and control gate layer are formed over wafer 301. Both layers are then photo lithographically patterned to form control gate 401 and charge storage structure 403. Control gate 401 is formed of a control gate material (e.g. doped polysilicon and/or metal). In one embodiment, gate 307 has a thickness in the range of 800-1500 Angstroms, but may have other thicknesses in other embodiments.

In one embodiment, the charge storage layer is formed by forming a tunnel dielectric layer over wafer 301, followed by forming a layer of discrete charge storage elements 407 (e.g. silicon nanocrystals, silicon germanium nanocrystals, metal nanoclusters) on the tunnel dielectric layer, and then followed by forming a control gate dielectric layer over the discrete charge storage elements. In FIG. 4, the tunnel dielectric and control gate dielectric material are shown as dielectric 405 in charge storage structure 403. In one embodiment, the discrete charge storage elements 407 structures have a diameter in the range of 20 to 100 nanometers, but may have diameters of different ranges in other embodiments. In the embodiment shown, gate oxide 305 and charge storage dielectric 405 are shown as separate items. However, they may appear as a contiguous oxide structure.

During a programming operation, charge is selectively stored in the discrete charge storage elements 407 to change the voltage threshold of the cell to store a different logic value in the cell. The value stored in the cell can be read during a read operation.

During the formation of the charge storage structure 403, an oxidation process is performed at an elevated temperature to oxidize the surface of the semiconductor material of substrate 303 and gate 307. Because regions 315 and 317 have been implanted with fluorine dopants, oxidation is enhanced at those locations which cause the thickness of gate oxide 305 to increase at edge regions 421 and 423.

Furthermore, in some embodiments, during an oxidation process subsequent to implantation, the fluorine dopants may replace oxygen atoms in the silicon oxide molecules of a gate oxide to form silicon oxide fluorine molecules. The inclusion of silicon oxide fluorine molecules lowers the dielectric constant of the oxide. Regions of a gate oxide with a lower dielectric constant may provide for a lower electric field formation at locations corresponding to the lower dielectric gate oxide regions during a transistor operation. Thus, a lower electric field corresponding to the edge regions of a gate oxide that includes silicon oxide fluorine molecules may reduce the program disturb caused by a thinner gate oxide at the corner regions (e.g. corner regions 129, 131). Hence, for some embodiments, even if the implanted fluorine does not significantly increase the thickness of the gate oxide at a problematic corner region, the lowering of the dielectric constant at that region can reduce the electric field produced and therefore lower the program disturb.

As set forth above, the implantation of fluorine dopants into selective areas of a wafer may provide for the inclusion of fluorine into selective portions of a gate oxide such that those selective portions have a greater concentration of fluorine (at least 10 times greater in some embodiments) than other portions of the gate oxide. As set forth above, a thicker gate oxide at selective portions or a decreased dielectric constant in selective portions of the gate oxide may occur with a greater fluorine dopant concentration in selective portions of a gate oxide. In other embodiments, the selective portions of the gate oxide may have a concentration of fluorine that is at least 100 greater than the other portions, which may desirably provide in some embodiments, for an even greater gate oxide thickness or decreased dielectric constant. The use of angled implantation of fluorine in some embodiments may allow for the implantation of fluorine into selective regions without the use of additional photo lithographic masking steps. Although other embodiments may use an additional photo lithographic mask for fluorine implantation into specific areas of a wafer.

After the patterning of gate 401 and charge storage structure 403, source region 413 and drain region 411 are formed in substrate 303 by the implantation of conductivity dopants (boron, arsenic, phosphorous) into substrate 303 using the control gate and select gate as implantation masks. Source and drain extension regions may be implanted prior to the formation of spacers 419 and 417. Afterwards, deep source and drain regions are formed using the spacers as implantation masks.

In other embodiments, a non volatile memory cell may be formed by other processes. For example, in some embodiments, the left side walls of select gate 307, gate oxide 305, and control gate 401 (relative to the view shown in FIG. 4) are formed with the same patterning mask where these sidewalls are aligned. With these embodiments, the masking and etching processes used to form the left sidewalls of select gate 307 and gate oxide 305 would be performed subsequent to the masking and etching processes used to form the right side walls of select gate 307 and gate oxide 305 (relative to the view shown in FIG. 4). Thus, with these embodiments, the patterning of the select gate and select gate oxide is performed with multiple masking and etching processes occurring at different times. Furthermore, in some examples of these "multiple mask" gate patterning embodiments, the fluorine dopants would be implanted at an angle underneath the right sidewall of gate oxide 305 and in gate oxide 305 after the formation of the right sidewalls of select gate 307 and gate oxide 305 and before the formation of the left sidewalls of select gate 307 and gate oxide 305 (relative to the view shown in FIG. 4). Thus, in some of these embodiments, only the right edge portion of the gate oxide (relative to the view shown in FIG. 4) would include fluorine dopants. Although other "multiple mask" gate patterning embodiments may include implanting fluorine dopants into and underneath the left sidewall of gate oxide 305 after its formation.

In other embodiments, a non volatile memory cell may include other types of charge storage materials such as nitride or poly silicon. The charge storage structure may have different forms in other embodiments, e.g. a spacer form or gate form. Furthermore, in other embodiments, the non volatile memory may have other configurations such as a floating gate configuration. In some embodiments, the non volatile memory cell does not include a select gate. In other embodiments, a memory cell may be of another type of non volatile memory cell (such as an NAND flash memory cell).

After the stage shown in FIG. 4, other structures may be formed on wafer 301. For example, silicide structures may be formed on control gate 401, select gate 307, source region 413, and drain region 411. Conductive interconnect structures (not shown) may be formed over substrate 303 to electrically couple the structures of the memory cells and other devices formed on the wafer together and to external connectors (e.g. bond pads). Afterwards, the wafer is singulated into individual integrated circuits, each with a plurality of memory cells as shown in FIG. 4 and with other circuitry (not shown) including other circuitry of the memory.

Figure 5:
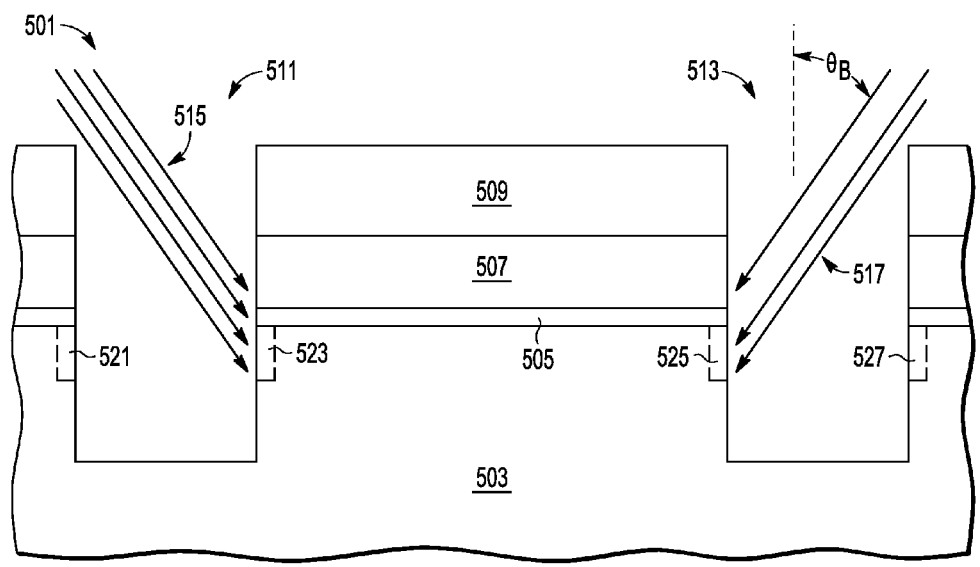
FIGS. 5-7 are partial cutaway side views of a wafer during various stages of manufacturing according to another embodiment of the present invention.
Figure 6:
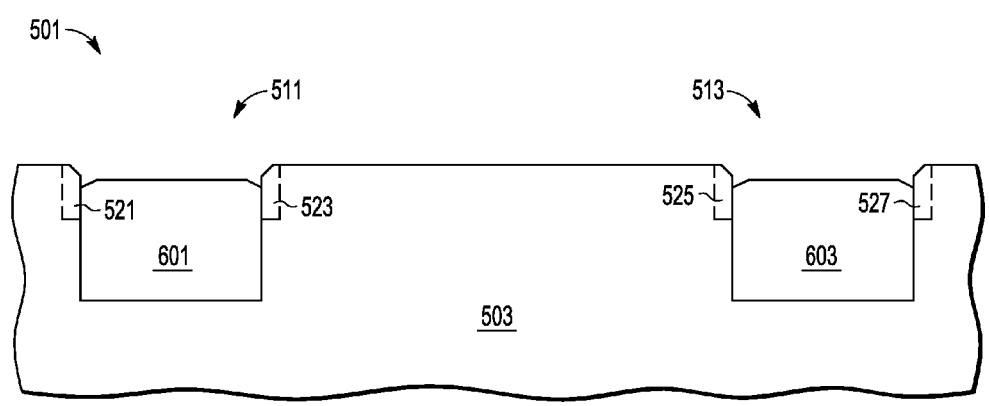
Figure 7:
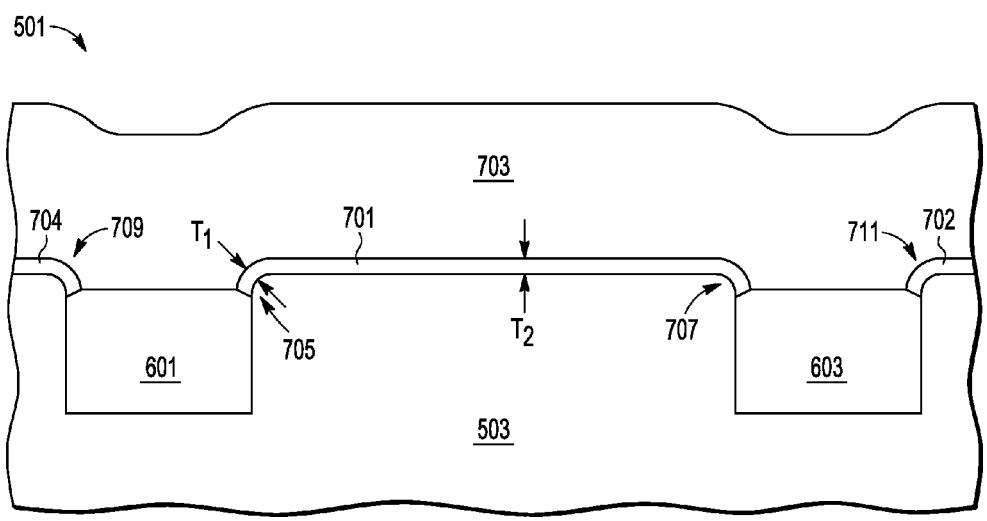

FIGS. 5-7 set forth views of various stages in the manufacture of a wafer according to another embodiment of the present invention. FIG. 5 is a side view of a wafer 501 used for forming a non volatile memory device. In the embodiment shown, wafer 501 includes a substrate that includes semiconductor material. Located on substrate 503 are pad oxide layer 505, pad nitride layer 507 and photo resist mask 509. In one embodiment, mask 509 has a thickness in range of 5000-10000 Angstroms, but may be of other thicknesses in other embodiments. In one embodiment, oxide layer 505 has a thickness of 150 Angstroms and mask 509 has a thickness of 1400 Angstroms, however, these layers may have other thicknesses in other embodiments. Thus, for some embodiments, the proportionality of the thicknesses of layers 507 and 505 and mask 509 in FIG. 5 is skewed in order to show certain features of the manufacturing stage.

FIG. 5 shows wafer 501 at a stage after trenches 511 and 513 have been formed in substrate 503. Trenches 511 and 513 are formed by forming corresponding openings in photo resist mask 509 and etching the materials of layers 507 and 505 to expose substrate 503. A timed etch with an appropriate etch chemistry is then used to remove the material of substrate 503.

FIG. 5 shows wafer 501 as fluorine dopants are being implanted at an angle ($\theta_B$) into wafer 501 to form implant regions 521, 523, 525, and 527 in substrate 503. In one embodiment, $\theta_B$ is in the range of 7-45 degrees with respect to a 90 degree normal angle from the surface of the substrate, but may be of other angles in other embodiments. In one embodiment, the fluorine dopants are implanted at an energy in the range of 10-30 KeV and at a dosage of $10^{13}$ to $10^{15}$ ions/cm$^2$, but other dopants and energies may be used in other embodiments. In one embodiment, the fluorine is implanted to a depth of 10-50 Angstroms, but may be implanted to other depths in other embodiments. In some embodiments, mask 509 and layer 507 may be removed prior to the implantation of the fluorine dopants.

FIG. 6 shows a partial cutaway side view of wafer 501 after trenches 511 and 513 have been filed with a dielectric material (e.g. oxide) to form trench isolation structures 601 and 603. In one embodiment, the isolation structures are deposited by first removing photo resist mask 509. A layer of dielectric material is then deposited over wafer 501. A chemical mechanical polish is performed on wafer 501 down to nitride layer 507. Afterwards, the nitride layer 507 is removed with a wet etch that is selective to the nitride but leaves the oxide unetched. At this time, other implantation steps may be performed where layer 505 protects substrate 503 from damage. Afterwards, layer 505 is removed with an etchant that also reduces the height of isolation structures 601 and 603. Removal of layer 505 exposes the top side of regions 521, 523, 525, and 527. Trench isolation structures may be formed by other processes and/or have other forms in other embodiments.

FIG. 7 is a cutaway side view of wafer 501 after the formation of select gate oxides 704, 701, and 702 and a select gate 703 on wafer 501. FIG. 7 is of similar directional view of that of FIG. 2 but is at a stage prior to the formation of the charge storage structures and control gates. In one embodiment, gate oxides 701, 702, and 704 are formed from the oxidation of substrate 503. Gate oxide 701 is for one memory cell, gate oxide 704 is for a second memory cell, and gate oxide 702 is for a third memory cell, where select gate 703 traverses all three memory cells.

Gate oxide edge regions 709, 705, 707, and 711 are formed from the oxidation of fluorine implanted regions 521, 523, 525, and 527, and accordingly, have a higher concentration (e.g. at least 10 times greater in some embodiments) of fluorine dopants than the other portions of the gate oxides. In some embodiments, the edge regions have a fluorine concentration that is at least 100 times greater than the fluorine concentration of other portions of the gate oxide. Because these edge regions where formed with a semiconductor material that was doped with fluorine, oxide formation progresses at a greater rate at these areas relative to areas that were formed from semiconductor material that was not doped with fluorine. Accordingly in FIG. 7, the gate oxide edge regions (707, 705) have a greater thickness than a gate oxide edge region formed from a semiconductor material that was not doped with fluorine. For example, in FIG. 7, the thicknesses of t1 (at edge region 705 of gate oxide 701) and t2 (at a center region of gate oxide 701) are relativity uniform whereas with FIG. 2, the edge oxide thickness t1 is much less than the center region oxide thickness t2.

Furthermore, because edge oxide regions 709, 705, 707, and 711 have fluorine dopants, those regions, in some embodiments, may have a lower dielectric constant than the center area of the gate oxide. Accordingly, lower electric fields are produced at those regions which may also reduce problems such as program disturb during memory operations.

After the stage of FIG. 7, charge storage structures and control gates are formed on wafer 501. Source and drain regions are then formed in substrate 503. Electrical interconnects and external conductors are then formed on wafer 501, followed by the singulation of wafer 501 into multiple integrated circuits. See the discussion above with regard to FIGS. 3-4 regarding further details on the formation of these structures and processes.

As with the embodiment of FIGS. 3-4, the embodiment of FIGS. 5-7 set forth processes for providing a gate oxide that has edge regions with a greater concentration (at least 10 times greater) of fluorine than a center region without the use of extra masks. With the embodiment of FIGS. 5-7, the mask 509 that is used to form the trench isolation structures 601 and 603 is also used for the angled implantation of the fluorine dopants into selected regions of the wafer.

Figure 8:
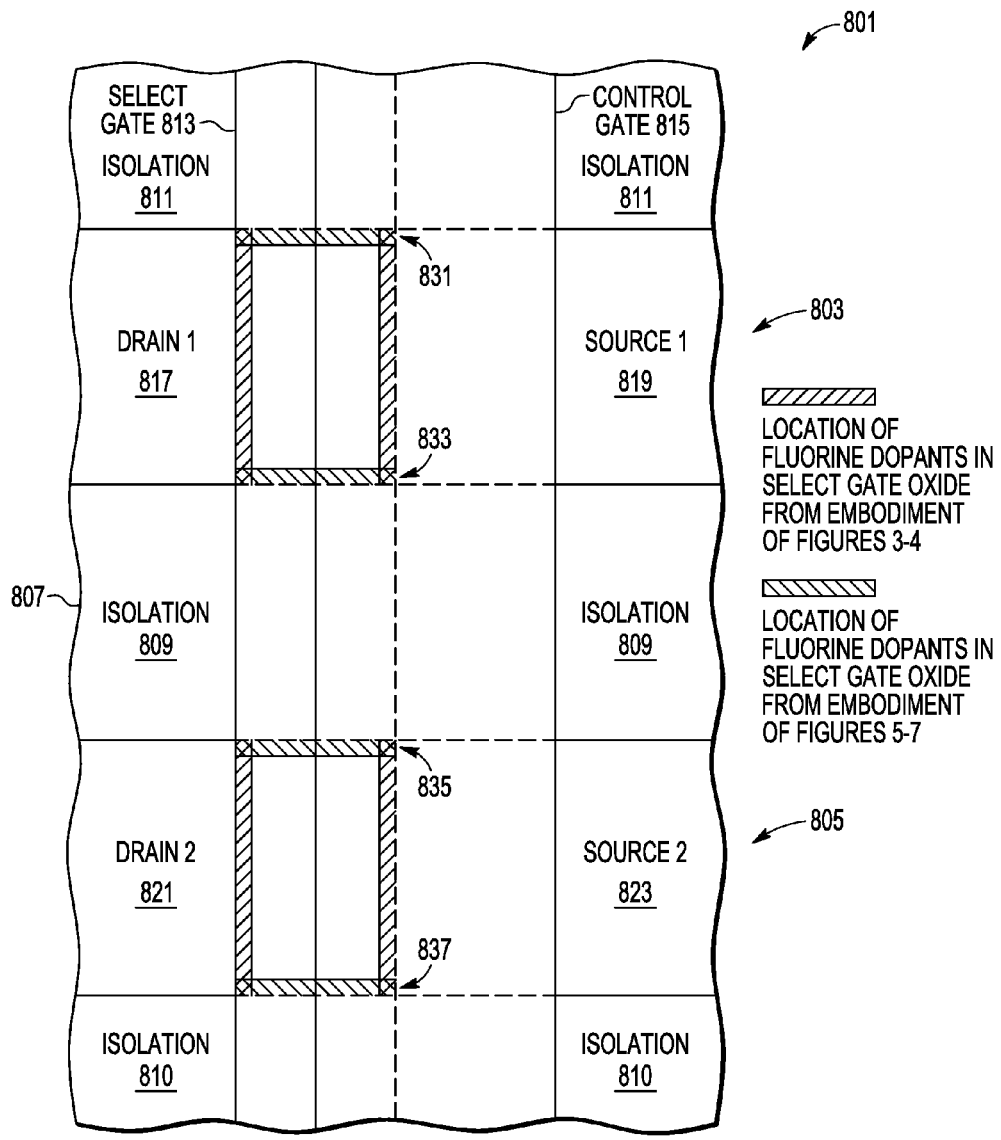
FIG. 8 is a partial top view of a wafer during a stage of manufacturing according to different embodiments of the present invention.

FIG. 8 shows a partial top view of wafer 801 at a stage in its manufacture that illustrates the locations of the fluorine dopants in the gate oxide due to the fluorine implantation of the embodiment of FIG. 3-4 and due to the fluorine implantation of the embodiment of FIGS. 5-7. Shown in FIG. 8 are two memory cells 803 and 805. Memory cells 803 and 805 are split gate memory cells that include a control gate 815 and a select gate 813 that are located over substrate 807 across both cells 803 and 805. A left side portion (relative to the view of FIG. 8) of control gate 815 is located over a right side portion of select gate 813. Cell 803 includes a drain region 817 and a source region 819 located in semiconductor substrate 807 and generally separated by an area in substrate 807 beneath control gate 815 and select gate 813. Cell 805 includes a drain region 821 and a source region 823 located in active regions of substrate 807 and generally separated by an area in substrate 807 beneath control gate 815 and select gate 813. Memory cells 803 and 805 each include channel region located in substrate 807 beneath control gate 815 and select gate 813. Semiconductor substrate 807 includes isolation structures 811, 809, and 810 that run horizontally (relative to the view of FIG. 8) for isolating the memory cells structures in semiconductor substrate 807. Not shown in FIG. 8 is a charge storage structure located in a layer below control gate 815.

In FIG. 8, the areas designated by the upward sloping lines are the areas of the select gate oxide that have a greater concentration of fluorine dopants due to the processes of the embodiment of FIGS. 3-4. The areas designated by the downward sloping lines are the areas of the select gate oxide that have a greater concentration of fluorine dopants due to the processes of the embodiment of FIGS. 5-7.

As shown in FIG. 8, the embodiment of FIGS. 3-4 provides for an increased concentration of fluoride dopants (and thicker oxide in some embodiments) along the vertical edges (relative to the view shown in FIG. 8) of the select gate oxides. The embodiment of FIGS. 5-7 provides for an increased concentration of fluoride dopants (and thicker oxide in some embodiments) along the horizontal edges (relative to the view shown in FIG. 8) of the select gate oxides. Accordingly, either embodiment will provide for an increased concentration of fluorine dopants (or thicker gate oxides in some embodiments) at the corner regions 831, 833, 835, and 837 of the select gate oxides that are problematic, in some embodiments, for program disturb in the non volatile memory cell. In some embodiments, the fluorine implants of both FIG. 3 and FIG. 5 may be performed to provide for increased fluorine concentration (and thicker gate oxide in some embodiments) around all edges of a gate oxide.

Although, the fluorine implantation processes set forth above have been described with respect to a gate oxide of a select gate, those processes may be utilized to provide for an increase fluorine concentration (and a thicker oxide in some embodiments) of edge regions of gate oxides of other types of transistors.

In one embodiment, a non-volatile memory cell includes a gate oxide over a substrate. The substrate including semiconductor material. The non-volatile memory cell includes a gate over the gate oxide. The gate oxide has an edge portion between the gate and the substrate and a non-edge portion between the gate and the substrate. The edge portion has a first concentration of fluorine and the non-edge portion has a second concentration of fluorine. The first concentration is at least 10 times greater than the second concentration.

In another embodiment, a method for forming a device includes forming an oxide layer on a substrate including a semiconductor material, forming a gate layer over the oxide layer, patterning the gate layer and the oxide layer to form a gate electrode over a gate oxide, and performing an angled implant of fluorine into locations of the device such that the gate oxide has an edge portion between the gate electrode and the substrate with a first concentration of fluorine and a non-edge portion between the gate electrode and the substrate with a second concentration of fluorine that is different than the first concentration.

In another embodiment, a method for forming a device includes forming a trench in a substrate including a semiconductor material, performing an angled implant to implant fluorine into sidewalls of the trench, filling the trench with isolation material, forming an oxide layer on the substrate adjacent the trench, forming a gate layer over the oxide layer, and patterning the gate layer and the oxide layer to form a gate electrode over a gate oxide. The gate oxide has an edge portion between the gate electrode and the substrate with a first concentration of fluorine and a non-edge portion between the gate electrode and the substrate with a second concentration of fluorine. The first concentration is at least 10 times greater than the second concentration.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a device, comprising:
   forming an oxide layer on a substrate including a semiconductor material;
   forming a gate layer over the oxide layer;
   patterning the gate layer and the oxide layer to form a gate electrode over a gate oxide;
   performing an angled implant of fluorine into locations of the device such that the gate oxide has an edge portion between the gate electrode and the substrate with a first concentration of fluorine and a non-edge portion between the gate electrode and the substrate with a second concentration of fluorine that is different than the first concentration;
   forming a trench in the substrate; and
   filling the trench with isolation material, wherein the performing the angled implant is performed after the forming the isolation trench and before the filling the trench, wherein the performing the angled implant implants fluorine into sidewalls of the trench.

2. The method of claim 1, wherein the forming the oxide layer, the forming the gate layer, and the patterning the gate layer and the oxide layer are performed after the performing the angled implant, and wherein the edge portion of the gate oxide is closer to the trench than is the non-edge portion of the gate oxide.

3. The method of claim 1, wherein the performing the angled implant is performed after patterning the gate layer and the oxide layer to define at least one side wall of the gate electrode, wherein the performing the angled implant implants fluorine into the gate oxide and into the substrate below the gate oxide.

4. The method of claim 3, wherein the gate electrode is further characterized as a select gate of a non-volatile memory cell, and the method further comprises:
   after the performing the angled implant, forming a charge storage layer overlapping a sidewall of the select gate, and forming a control gate over the charge storage layer.

5. The method of claim 1 wherein the performing an angled implant of fluorine into locations of the device include implanting fluorine into a region of the substrate, wherein the method includes oxidizing at least a portion of the region of the substrate to increase a thickness of the gate oxide.

6. A method for forming a device, comprising:
   forming a trench in a substrate including a semiconductor material;
   performing an angled implant to implant fluorine into sidewalls of the trench;
   filling the trench with isolation material;
   forming an oxide layer on the substrate adjacent the trench;
   forming a gate layer over the oxide layer; and
   patterning the gate layer and the oxide layer to form a gate electrode over a gate oxide, wherein the gate oxide has an edge portion between the gate electrode and the substrate with a first concentration of fluorine and a non-edge portion between the gate electrode and the substrate with a second concentration of fluorine, the first concentration is at least 10 times greater than the second concentration.

* * * * *